(12) United States Patent
Yamazaki

(10) Patent No.: US 8,546,960 B2
(45) Date of Patent: Oct. 1, 2013

(54) MANUFACTURING METHOD OF SEMICONDUCTOR DEVICE, SEMICONDUCTOR DEVICE AND MOBILE COMMUNICATION DEVICE

(75) Inventor: Takashi Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/353,798

(22) Filed: Jan. 19, 2012

(65) Prior Publication Data

US 2012/0187585 A1 Jul. 26, 2012

(30) Foreign Application Priority Data

Jan. 20, 2011 (JP) .................................. 2011-009549

(51) Int. Cl.
*H01L 23/29* (2006.01)
*H01L 23/02* (2006.01)
*H01L 23/28* (2006.01)
*H01L 21/00* (2006.01)

(52) U.S. Cl.
USPC ........... 257/795; 257/794; 257/678; 257/787; 438/106; 438/121

(58) Field of Classification Search
USPC 257/678, 701, 706, 712, 713, E23.101–E23.109, 257/E23.116–E23.121, 787–796; 438/106, 438/121, 122, 124, 127
See application file for complete search history.

(56) References Cited

U.S. PATENT DOCUMENTS

| 6,740,411 B2 * | 5/2004 | Kojima et al. ................ 428/413 |
| 2009/0000114 A1 * | 1/2009 | Rao et al. ........................ 29/832 |
| 2012/0015687 A1 | 1/2012 | Yamada et al. |

FOREIGN PATENT DOCUMENTS

| JP | 10-209368 | 8/1998 |
| JP | 2004-193187 | 7/2004 |

OTHER PUBLICATIONS

"JIS K 5600-5-6: Testing Methods for Paints—Part 5: Mechanical Property of Film—Section 6: Adhesion Test (Cross-Cut Test)", Japanese Industrial Standard, Reference No. JIS K 5600-5-6 : 1999 (E), Apr. 20, 1999, 13 Pages.
"JIS K 5400-1990: Testing Methods for Paints", Japanese Industrial Standard, Published on Feb. 1, 1990, pp. 103-109.

* cited by examiner

*Primary Examiner* — Chuong A Luu
*Assistant Examiner* — Cory Eskridge
(74) *Attorney, Agent, or Firm* — Oblon, Spivak, McClelland, Maier & Neustadt, L.L.P.

(57) ABSTRACT

A manufacturing method of a semiconductor device includes: sealing a semiconductor chip with a sealing resin containing a filler; exposing a part of the filler; etching at least a part of the exposed filler; and forming a metal film at least at a part of a surface of the sealing resin including inner surfaces of holes formed at the surface of the sealing resin by the etching.

16 Claims, 7 Drawing Sheets

MANUFACTURING METHOD OF SEMICONDUCTOR DEVICE, SEMICONDUCTOR DEVICE AND MOBILE COMMUNICATION DEVICE

CROSS-REFERENCE TO RELATED APPLICATION

This application is based upon and claims the benefit of priority from the prior Japanese Patent Application No. 2011-009549, filed on Jan. 20, 2011; the entire contents of which are incorporated herein by reference.

FIELD

Embodiments described herein relate to a manufacturing method of a semiconductor device, a semiconductor device, and a mobile communication device.

BACKGROUND

In recent years, an influence of electromagnetic field noise from peripheral environments on a semiconductor device becomes considerable according to a small-sizing and high performance of the semiconductor device mounted on an electronic device. Accordingly, it is proposed that the semiconductor device mounted at a portion which is easy to be affected by the electromagnetic field noise is covered with a metal case to reduce the influence of the electromagnetic field noise by giving a shielding property in a conventional electronic device.

DETAILED DESCRIPTION

A manufacturing method of a semiconductor device according to an embodiment includes: sealing a semiconductor chip with a sealing resin containing a filler; exposing a part of the filler; etching at least a part of the exposed filler; and forming a metal film at least at a part of a surface of the sealing resin including inner surfaces of holes formed at the surface of the sealing resin by the etching.

Hereinafter, embodiments are described with reference to the drawings.

Embodiment

Figure 1:
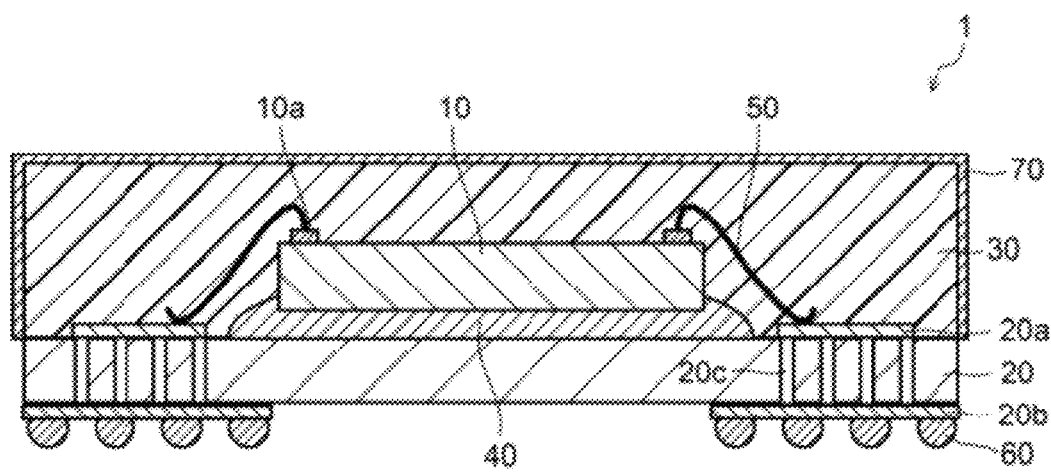
FIG. 1 is a sectional view of a semiconductor device according to the embodiment.

FIG. 1 is a sectional view of a semiconductor device 1 according to an embodiment. The semiconductor device 1 includes a semiconductor chip 10, a mounting substrate 20 to mount the semiconductor chip 10, a sealing resin (molding resin) 30 sealing the semiconductor chip 10, and a metal film 70 formed on the sealing resin 30 as an electromagnetic shield.

The semiconductor chip 10 is bonded to a surface of the mounting substrate 20 with a mounting material 40 such as a solder. Electrodes 10a for signal input/output formed at the semiconductor chip 10 are connected to surface wirings 20a of the mounting substrate 20 by bonding wires 50.

The mounting substrate 20 is a printed wiring board (a glass epoxy sheet) such as an FR4 (Flame Retardant Type 4). An etylene tetrafluoride resin, ceramics such as alumina ($Al_2O_3$), aluminum nitride (AlN) may be used as a material of the mounting substrate 20 other than the FR4.

The surface wirings 20a and back wirings 20b being metal wirings, and through holes 20c connecting the surface wirings 20a and the back wirings 20b are formed at the mounting substrate 20. An inner surface of the through hole 20c is covered with an electric conductor, and the surface wiring 20a and the back wiring 20b are electrically connected.

BGAs (ball grid array) 60 are formed at a back surface of the mounting substrate 20. The BGA 60 is electrically connected to the electrode 10a of the semiconductor chip 10 via the back wiring 20b, the through hole 20c, the surface wiring 20a, and the bonding wire 50. It may be constituted such that LGAs (land grid array) are formed at the back surface of the mounting substrate 20 instead of the BGAs 60.

The sealing resin 30 contains silica ($SiO_2$) as the filler. In this embodiment, at least a part of silica contained in the sealing resin is etched, and adherence of the metal film 70 is improved by an anchoring effect of holes formed by the etching. Accordingly, a content of silica is preferable to be higher (for example, 80 mass % or more). Besides, a particle size of silica contained in the sealing resin 30 is preferable to be approximately several μm to several dozen μm because it is necessary to form the metal film 70 inside of the holes formed by the etching. Various kinds of materials can be used as the filler contained in the sealing resin 30 without being limited to silica as long as the etching is possible.

The metal film 70 functions as an electromagnetic shield reducing electromagnetic field noise incident on the semiconductor chip 10 mounted inside the semiconductor device 1 and the electromagnetic field noise radiated from the semiconductor chip 10 toward outside. Various metals can be used as a material of the metal film 70, but it is preferable to use a metal of which electrical resistance is small and cost is relatively cheap (for example, copper (Cu)). In this embodiment, a film in which a nickel (Ni) film (hereinafter, referred to as the Ni film) as an oxidation preventing film is formed on a copper (Cu) film (hereinafter, referred to as the Cu film) is used as the metal film 70. The metal film 70 may be formed at side surfaces of the mounting substrate 20.

A thickness of the Cu film is preferable to be within a range of 2 μm to 5 μm. It is impossible to obtain enough electromagnetic shield effect when the thickness of the Cu film is less than 2 μm. It is impossible to obtain enough adherence when the thickness of the Cu film exceeds 5 μm. The thickness of the Cu film is more preferable to be within a range of 3 μm to 4 μm. Besides, the nickel (Ni) film formed on the Cu film functions as the oxidation preventing film if the thickness of the Ni film is 0.3 μm or more.

(Manufacturing of Metal Film 70)

FIG. 2A to FIG. 2H are views illustrating an example of a formation process of the metal film 70. The metal film 70 is formed by an electroless plating. Hereinafter, a formation method of the metal film 70 is described with reference to FIG. 2A to FIG. 2H.

(First Process (Refer to FIG. 2A))

A masking tape M is adhered to the back surface of the mounting substrate 20 of a semiconductor device 1a before the metal film 70 is formed, and the back wirings 20b and the BGAs 60 formed at the back surface of the mounting substrate 20 are covered with the masking tape M. This first process is performed to prevent a short circuit of the back wirings 20b and the BGAs 60 resulting from the formation of the metal film 70.

(Second Process (Refer to FIG. 2B))

Next, a degreasing cleaning of the semiconductor device 1a is performed by a surface active agent and so on to remove foreign particles D (for example, dust or oil content) adhered on a surface of the semiconductor device 1a. This second process is performed to improve the adherence of the metal film 70 to the sealing resin 30 by performing the degreasing cleaning of the semiconductor device 1a.

(Third Process (Refer to FIG. 2C))

Figure 2A:
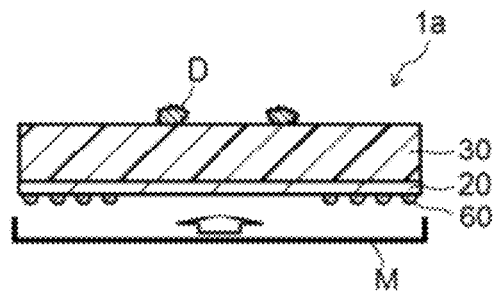
FIG. 2A to FIG. 2H are views illustrating an example of a formation process of a metal film included by the semiconductor device according to the embodiment.
Figure 2B:
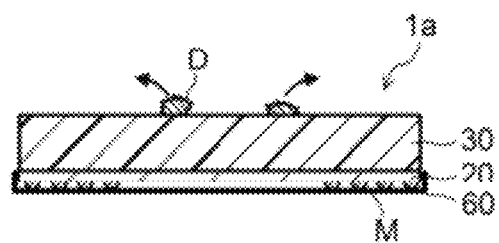
Figure 2C:
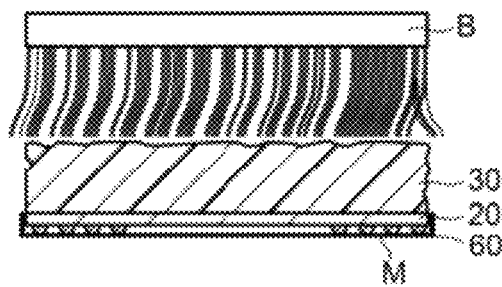
Figure 2D:
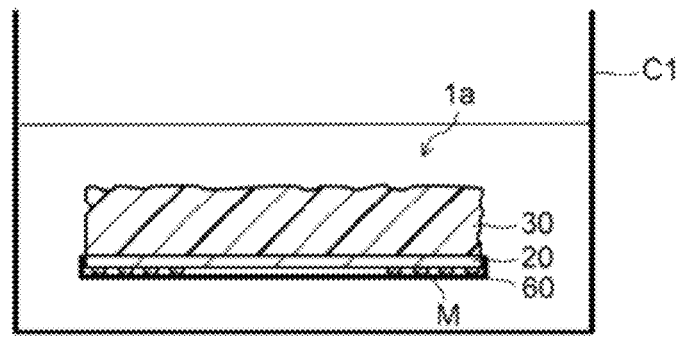
Figure 2E:
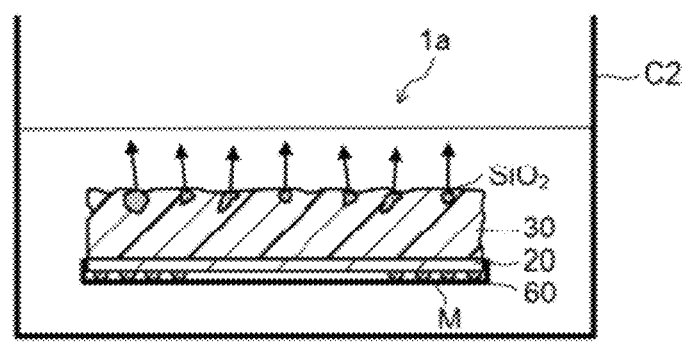
Figure 2F:
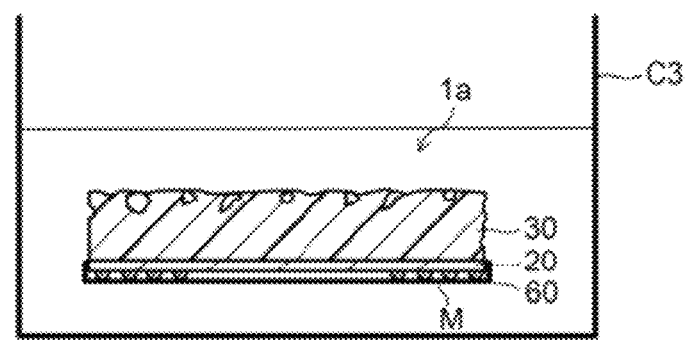
Figure 2G:
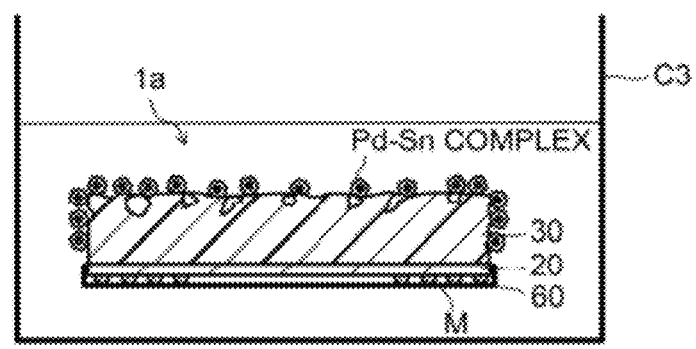
Figure 2H:
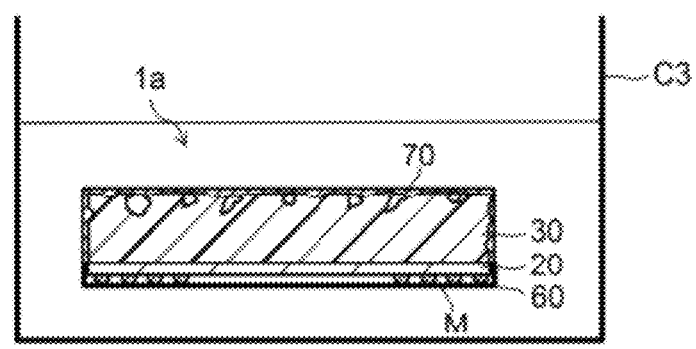

Burrs of the sealing resin 30 of the semiconductor device 1a are removed, and further, a process thinnly scraping off (for example, approximately 30 μm) a surface where the metal film 70 is formed is performed. This process may be performed by reciprocating a brush B and so on under a state pressing to the surface of the sealing resin 30 as illustrated in FIG. 2C, or a blast process may be performed. In the blast process, a particle body called as a projection material is crashed with the surface of the semiconductor device 1a, and thereby, the surface of the sealing resin 30 of the semiconductor device 1a is thinnly scraped off. In this third process, the surface of the sealing resin 30 is thinnly scraped off to expose a part of silica contained in the sealing resin 30.

(Fourth Process (Refer to FIG. 2D))

The semiconductor device 1a is put in a container C1 containing pure water and so on and an ultrasonic cleaning is performed for the semiconductor device 1a to remove dust generated at the third process.

(Fifth Process (Refer to FIG. 2E))

After the semiconductor device 1a is dried, the semiconductor device 1a is put in a container C2 containing an etching solution to etch silica contained in the sealing resin 30 exposed by the third process.

(Sixth Process (Refer to FIG. 2F))

The semiconductor device 1a is immersed and left for a while in a container C3 containing sulfuric acid diluted to approximately 10%, to perform a process activating the surface of the sealing resin 30 and improving the adherence.

(Seventh Process (Refer to FIG. 2G))

A catalytic metal being a nucleus of the electroless plating is adsorbed to the surface of the semiconductor device 1a. In this embodiment, Pd—Sn complexes are adsorbed to the surface of the semiconductor device 1a.

(Eighth Process (Refer to FIG. 2H))

After the Cu film is formed on the surface of the semiconductor device 1a, the nickel (Ni) film as the oxidation preventing film is further formed on the Cu film. These Cu film and Ni film are formed by the electroless plating.

Figure 3:
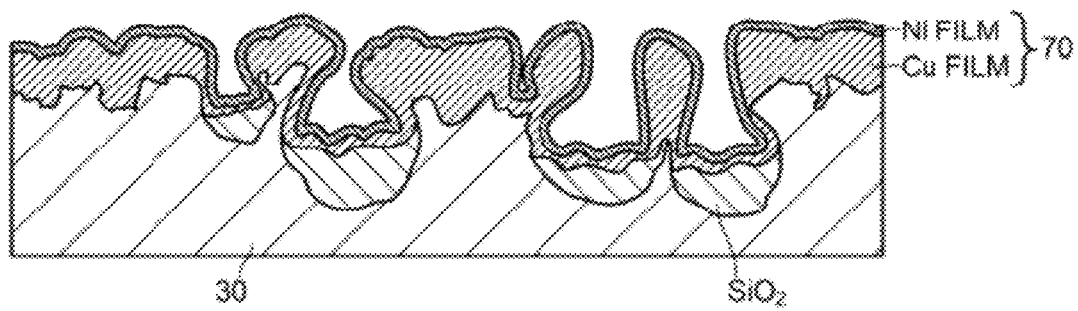
FIG. 3 is a sectional view of the metal film manufactured by a method according to the embodiment.

FIG. 3 is an enlarged sectional view of the metal film 70 manufactured by the method according to the embodiment. As illustrated in FIG. 3, the metal film 70 (the Cu film and the Ni film) formed by the method according to the embodiment enters into holes formed by removing at least a part of silica by the etching. Accordingly, the metal film 70 which is filled in the holes while partially being projected is formed, and the anchoring effect of the metal film 70 improves. As a result the adherence of the metal film 70 relative to the surface of the sealing resin 30 improves.

Figure 4:
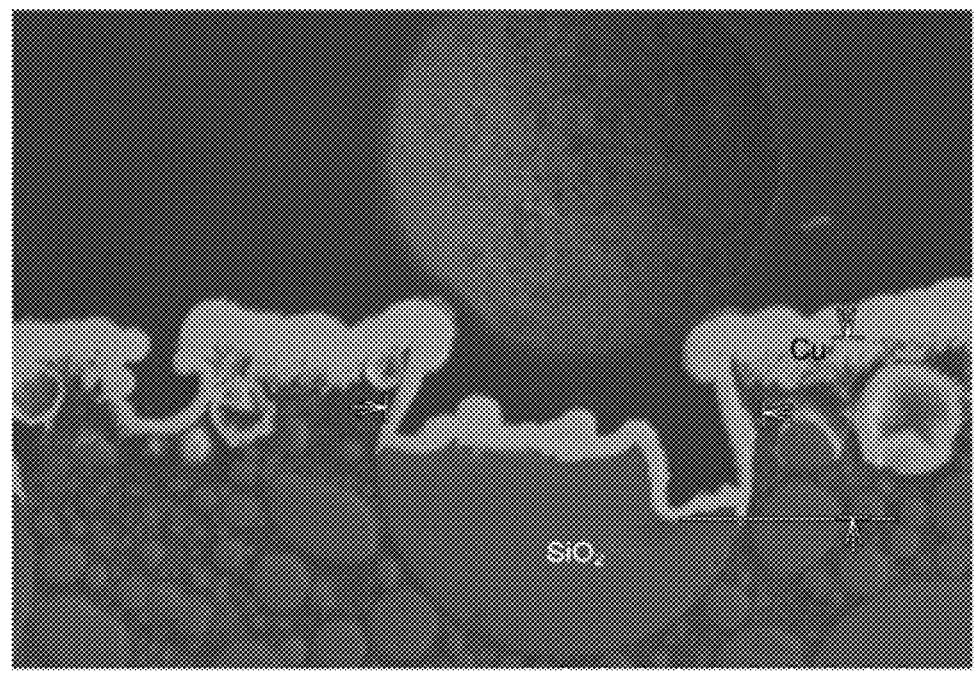
FIG. 4 is an image of a metal film cross section manufactured by the method according to the embodiment.

FIG. 4 is an enlarged image of a cross section of the metal film 70 (only the Cu film) manufactured by the method described with reference to FIG. 2A to FIG. 2H. An image of a sample in which the Cu film is formed for 4 μm after the sealing resin 30 is scraped off for 30 μm by the blast is illustrated in FIG. 4. It is verified that the metal film 70 formed by the method according to the embodiment enters into the hole which is formed by removing at least a part of silica by the etching in FIG. 4.

A metal film as an electromagnetic shield layer may be formed at the surface of the sealing resin 30 by a screen printing. FIG. 5A to FIG. 5D are views illustrating another example of a formation process of a metal film included by the semiconductor device 1. Hereinafter, a method forming the metal film by the screen printing is described with reference to FIG. 5A to FIG. 5D. The screen printing is performed in a vacuum (low-pressure) chamber.

(First Process (Refer to FIG. 5A))

A mask N is covered on the semiconductor device 1a before the metal film 70 is formed. Besides, silver (Ag) paste X is fully mixed up by a squeegee S to evacuate bubbles.

(Second Process (Refer to FIG. 5B))

Figure 5A:
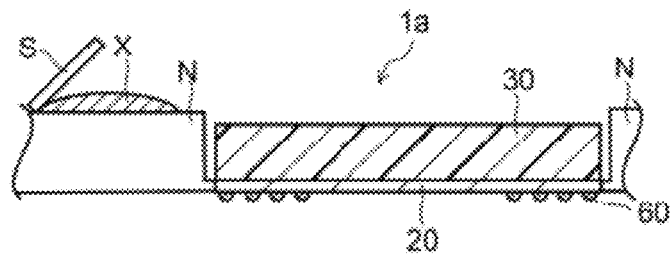
FIG. 5A to FIG. 5D are views illustrating another example of a formation process of the metal film included by the semiconductor device according to the embodiment.
Figure 5B:
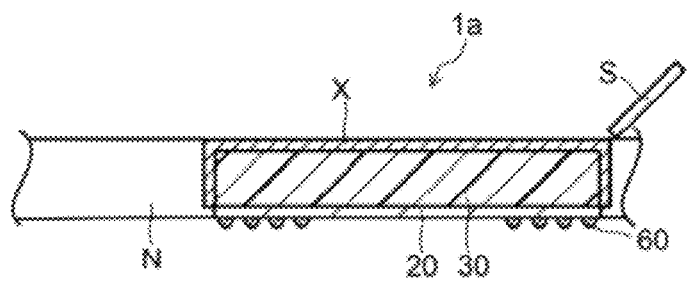
Figure 5C:
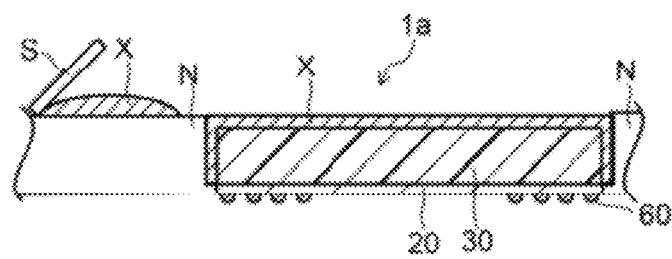

A first time printing is performed by moving the squeegee S from left to right relative to a sheet of FIG. 5B. The silver paste X is pushed out from an opening of the mask N to be adhered to the surface of the sealing resin 30 of the semiconductor device 1a by this printing.

(Third Process (Refer to FIG. 5C))

The semiconductor device 1a is left for a while at low atmospheric pressure to evacuate the bubbles mixed in the silver paste X adhered to the surface of the sealing resin 30 of the semiconductor device 1a. Preparation for a second time printing is performed while evacuating the bubbles mixed in the silver paste X.

(Fourth Process (Refer to FIG. 5D))

Figure 5D:
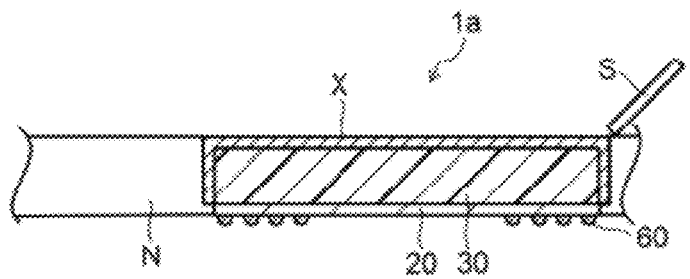

The second time printing is performed by moving the squeegee S from left to right relative to a sheet of FIG. 5D.

After the second time printing, the vacuum chamber is opened to atmosphere. A particle size (diameter) of silver contained in the silver paste X is preferable to be several μm or less. This is because the anchoring effect decreases because the silver paste X is unable to enter into the holes formed by the etching if the particle size of silver is large.

Besides, a thickness of a silver film formed on the surface of the sealing resin 30 is preferable to be within a range of 20 μm to 60 μm. The enough electromagnetic shield effect cannot be obtained if the thickness of the silver film is less than 20 μm. Besides, it is preferable that the thickness of the silver film is set to be 60 μm or less because an amount of the silver paste to be used increases and a manufacturing cost increases if the thickness of the silver film becomes thick. In the above-stated description, a case when the silver paste X is used is described, but a paste containing metal other than silver may be used.

EXAMPLE

Next, the Cu film manufactured by the method described with reference to FIG. 2A to FIG. 2H and a test result of the adherence thereof are described. In the example, the following ten kinds of samples A to J are manufactured, and peel strengths of respective samples A to J are examined. Conditions of the samples A to J are the same other than each thickness of the scraped sealing resin and each thickness of the Cu film formed at the surface of the sealing resin. Besides, the Ni film as the oxidation preventing film is formed on the Cu film.

A molding resin in which silica ($SiO_2$) is contained in an amount of 88 mass % is used for the sealing resin. It is preferable that the particle size of the exposed silica is larger in consideration of the anchoring effect of the metal film 70. In this invention, silica of which average particle size is approximately 20 μm, and a maximum particle size is 70 μm or less is used.

Besides, the etching of silica exposed by the blast is performed at a room temperature for 30 seconds. Further, in the electroless plating of the Cu film, a temperature of a plating solution is set to be 50° C. A process to improve the adherence of the Cu film is performed before the electroless plating.

(Sample A)
The Cu film and the Ni film are formed by the electroless plating after the sealing resin is scraped off for 10 μm by the blast process. The times for the electroless plating are for 30 minutes (2 μm) as for the Cu film, and for three minutes (0.3 μm) as for the Ni film.

(Sample B)
The Cu film and the Ni film are formed by the electroless plating after the sealing resin is scraped off for 10 μm by the blast process. The times for the electroless plating are for 45 minutes (3 μm) as for the Cu film, and for three minutes (0.3 μm) as for the Ni film.

(Sample C)
The Cu film and the Ni film are formed by the electroless plating after the sealing resin is scraped off for 10 μm by the blast process. The times for the electroless plating are for 75 minutes (4 μm to 5 μm) as for the Cu film, and for three minutes (0.3 μm) as for the Ni film.

(Sample D)
The Cu film and the Ni film are formed by the electroless plating after the sealing resin is scraped off for 20 μm by the blast process. The times for the electroless plating are for 30 minutes (2 μm) as for the Cu film, and for three minutes (0.3 μm) as for the Ni film.

(Sample E)
The Cu film and the Ni film are formed by the electroless plating after the sealing resin is scraped off for 20 μm by the blast process. The times for the electroless plating are for 45 minutes (3 μm) for the Cu film, and for three minutes (0.3 μm) for the Ni film.

(Sample F)
The Cu film and the Ni film are formed by the electroless plating after the sealing resin is scraped off for 20 μm by the blast process. The times for the electroless plating are for 75 minutes (4 μm to 5 μm) as for the Cu film, and for three minutes (0.3 μm) as for the Ni film.

(Sample G)
The Cu film and the Ni film are formed by the electroless plating after the sealing resin is scraped off for 30 μm by the blast process. The times for the electroless plating are for 30 minutes (2 μm) as for the Cu film, and for three minutes (0.3 μm) for as the Ni film.

(Sample H)
The Cu film and the Ni film are formed by the electroless plating after the sealing resin is scraped off for 30 μm by the blast process. The times for the electroless plating are for 45 minutes (3 μm) as for the Cu film, and for three minutes (0.3 μm) as for the Ni film.

(Sample I)
The Cu film and the Ni film are formed by the electroless plating after the sealing resin is scraped off for 30 μm by the blast process. The times for the electroless plating are for 75 minutes (4 μm to 5 μm) as for the Cu film, and for three minutes (0.3 μm) as for the Ni film.

(Sample J)
The Cu film and the Ni film are formed by the electroless plating after the sealing resin is scraped off for 40 μm by the blast process. The times for the electroless plating are for 75 minutes (4 μm to 5 μm) as for the Cu film, and for three minutes (0.3 μm) as for the Ni film.

(Adherence Test)
The adherence of the Cu film formed at the surface of the sealing resin is examined as for each of the samples A to J. The adherence of the Cu film is examined by a method called as a crosscut method. In this crosscut method, the adherence is evaluated by observing a state when cuts penetrating the Cu film and reaching the surface of the sealing resin are added in a grid state. A concrete test procedure is described hereinafter (refer to JIS-K5400-8.5, JIS-K5600-5-6 in detail).

(1) Ten pieces of cuts penetrating the Cu film and reaching the surface of the sealing resin are added, and thereafter, further ten pieces of cuts are added while changing a direction for 90 degrees.

(2) A cellophane adhesive tape of which length is 75 mm, width is 25 mm is attached and firmly adhered to the Cu film surface to which the cuts are added.

(3) An end of the cellophane adhesive tape is held under a state keeping the end of the cellophane adhesive tape in perpendicular to the Cu film surface after one minute to two minutes have passed since the cellophane adhesive tape is adhered, and it is momentarily (at one stroke) peeled off.

(4) A surface state of the Cu film after the cellophane adhesive tape is peeled off is visually observed to check a peeling condition of the Cu film.

(Test Results)
Results of the adherence test are represented in Table 1. The evaluation by the visual observation is made by a three-level evaluation of "1" to "3". The level "1" is "good" without any peeling off of the Cu film, the level "2" is "slightly bad" in which the Cu film is a little peeled off, and the level "3" is "bad" in which there are a lot of peeling off at the Cu film.

TABLE 1

| | | BLAST AMOUNT | | | |
|---|---|---|---|---|---|
| | | 10 μm | 20 μm | 30 μm | 40 μm |
| COPPER PLATING TIME (COPPER FILM THICKNESS) | 30 minutes (2 μm) | 1 (SAMPLE A) | 1 (SAMPLE D) | 1 (SAMPLE G) | — |
| | 45 minutes (3 μm) | 3 (SAMPLE B) | 2 (SAMPLE E) | 1 (SAMPLE H) | — |
| | 75 minutes (4-5 μm) | 3 (SAMPLE C) | 3 (SAMPLE F) | 2 (SAMPLE I) | 2 (SAMPLE J) |

As represented in Table 1, the evaluation results of the sample A to the sample J are as follows: the sample A is "1", the sample B is "3", the sample C is "3", the sample D is "1", the sample E is "2", the sample F is "3", the sample G is "1", the sample H is "1", the sample I is "2", and the sample J is "2".

As a result of the above-stated tests by the crosscut method, it turns out that the best thickness of the sealing resin to be scraped off is 30 μm, further, the best thickness of the Cu film is 2 μm as for the adherence. In consideration of the results and the electromagnetic shield effect, the thickness of the Cu film is preferable to be within a range of 2 μm to 5 μm, and more preferable to be within a range of 3 μm to 4 μm as stated above in the present embodiment.

As stated above, in the semiconductor device according to the present embodiment, the sealing resin is thinly scraped off until contained silica exposes, and the metal film as the electromagnetic shield layer is formed at the surface of the sealing resin after the exposed silica is etched. Therefore, the metal film is formed under a state in which the metal film enters into the holes formed by removing at least a part of silica by the etching. Accordingly, the anchoring effect of the metal film improves, and the adherence of the metal film relative to the surface of the sealing resin improves. Besides, the metal film to be the electromagnetic shield layer is directly formed at the surface of the sealing resin of the semiconductor device, and therefore, a whole of the semiconductor device including the electromagnetic shield can be small-sized compared to a case when the whole of the semiconductor device is surrounded by a metal plate.

Other Embodiments

Figure 6:
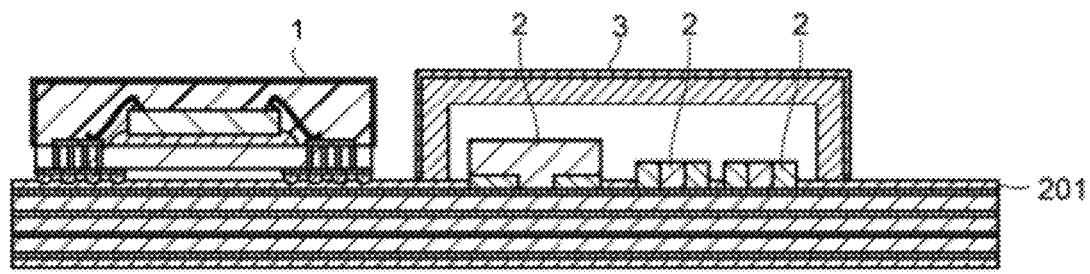
FIG. 6 is a sectional view of an electronic device according to other embodiment.

For example, a case 3 covering plural electronic components 2 mounted on a substrate 201 is formed by a resin containing silica (filler), and a surface of the case 3 is thinnly (approximately 30 μm) scraped off by a blast and so on to expose the contained silica. After that, a metal film as a shield layer is formed at a surface after the exposed silica is etched as illustrated in FIG. 6.

While certain embodiments have been described, these embodiments have been presented by way of example only, and are not intended to limit the scope of the inventions. Indeed, the novel embodiments described herein may be embodiment in a variety of other forms; furthermore, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:
    sealing a semiconductor chip with a sealing resin comprising silica ($SiO_2$);
    exposing at least a part of the silica;
    etching at least a part of the exposed silica; and
    forming a metal film on at least a part of a surface of the sealing resin including inner surfaces of holes formed at the surface of the sealing resin by the etching.

2. The method according to claim 1,
    wherein the metal film is formed by an electroless plating.
3. The method according to claim 1,
    wherein the metal film is formed by coating a silver paste.
4. The method according to claim 1,
    wherein 30 μm or more of the surface of the sealing resin is scraped off to expose at least a part of the silica.
5. The method according to claim 1, wherein the part of the silica is exposed by scraping off the surface of the sealing resin by a blast process.
6. A semiconductor device, comprising:
    a semiconductor chip;
    a sealing resin comprising silica ($SiO_2$) sealing the semiconductor chip; and
    a metal film formed on at least a part of a surface of the sealing resin including inner surfaces of holes formed in the sealing resin by removal of at least a part of the silica.
7. The device according to claim 6, wherein the metal film is a copper film.
8. The device according to claim 7, wherein a thickness of the copper film is 2 μm or more and 5 μm or less.
9. The device according to claim 8, wherein an oxidation preventing film is formed on the copper film.
10. The device according to claim 9, wherein the oxidation preventing film is a nickel film.
11. The device according to claim 10, wherein a thickness of the nickel film is 0.3 μm or more.
12. The device according to claim 6, wherein the metal film is a silver film.
13. The device according to claim 12, wherein a thickness of the silver film is 20 μm or more and 60 μm or less.
14. The device according to claim 6, wherein an average particle size of the silica is 20 μm.
15. A mobile communication device, comprising:
    a semiconductor chip;
    a sealing resin containing silica ($SiO_2$) sealing the semiconductor chip; and
    a metal film formed on at least a part of a surface of the sealing resin including inner surfaces of holes formed in the sealing resin by removal of at least a part of the silica.
16. The device according to claim 15, wherein the mobile communication device is a mobile phone.

* * * * *